United States Patent
Elmala et al.

(10) Patent No.: US 7,154,335 B2
(45) Date of Patent: Dec. 26, 2006

(54) VARIABLE GAIN AMPLIFIER WITH DIRECT CURRENT OFFSET CORRECTION

(75) Inventors: Mostafa Elmala, Beaverton, OR (US); Krishnamurthy Soumyanath, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 33 days.

(21) Appl. No.: 10/954,257

(22) Filed: Sep. 29, 2004

(65) Prior Publication Data

US 2006/0066395 A1   Mar. 30, 2006

(51) Int. Cl.
*H03F 3/45*   (2006.01)

(52) U.S. Cl. ...................................... 330/259; 327/307

(58) Field of Classification Search ................. 330/310, 330/259; 327/307
See application file for complete search history.

(56) References Cited

U.S. PATENT DOCUMENTS

| | | | |
|---|---|---|---|
| 5,724,653 A * | 3/1998 | Baker et al. ................. 455/296 |
| 6,407,630 B1 * | 6/2002 | Yao et al. ...................... 330/9 |
| 6,480,063 B1 * | 11/2002 | Ichihara ....................... 330/133 |
| 2003/0001653 A1 * | 1/2003 | Soumyanath et al. ........ 327/307 |
| 2005/0277396 A1 * | 12/2005 | Pipilos ...................... 455/253.2 |

* cited by examiner

*Primary Examiner*—Robert Pascal
*Assistant Examiner*—Alan Wong
(74) *Attorney, Agent, or Firm*—Kacvinsky LLC

(57) ABSTRACT

Techniques to provide DC-offset correction in a variable gain amplifier are described.

22 Claims, 6 Drawing Sheets

US 7,154,335 B2

VARIABLE GAIN AMPLIFIER WITH DIRECT CURRENT OFFSET CORRECTION

BACKGROUND

In wireless communication applications, it may be desirable to use variable gain amplifiers to amplify received information signals. These amplifiers provide a higher gain when an input signal has a lower level, and a lower gain when an input signal is at a higher level. Variable gain amplifiers, however, may generate direct current (DC) offsets due to component mismatches within each stage of the amplifiers. In wireless applications which require high gain amplifiers, this DC-offset may need to be removed or corrected without compromising data signal integrity.

The DC-offset of a variable gain amplifier may be removed by using certain DC blocking capacitors or feedback loops having various architectures. These techniques may require, however, the use of very high resistance values and capacitors that are too large for integration within microcircuits where space restraints on a die are at a premium. Consequently, there may be a need for improvements in DC-offset correction in variable gain amplifiers that utilize high value resistors with associated low signal distortion.

DETAILED DESCRIPTION

Figure 1:
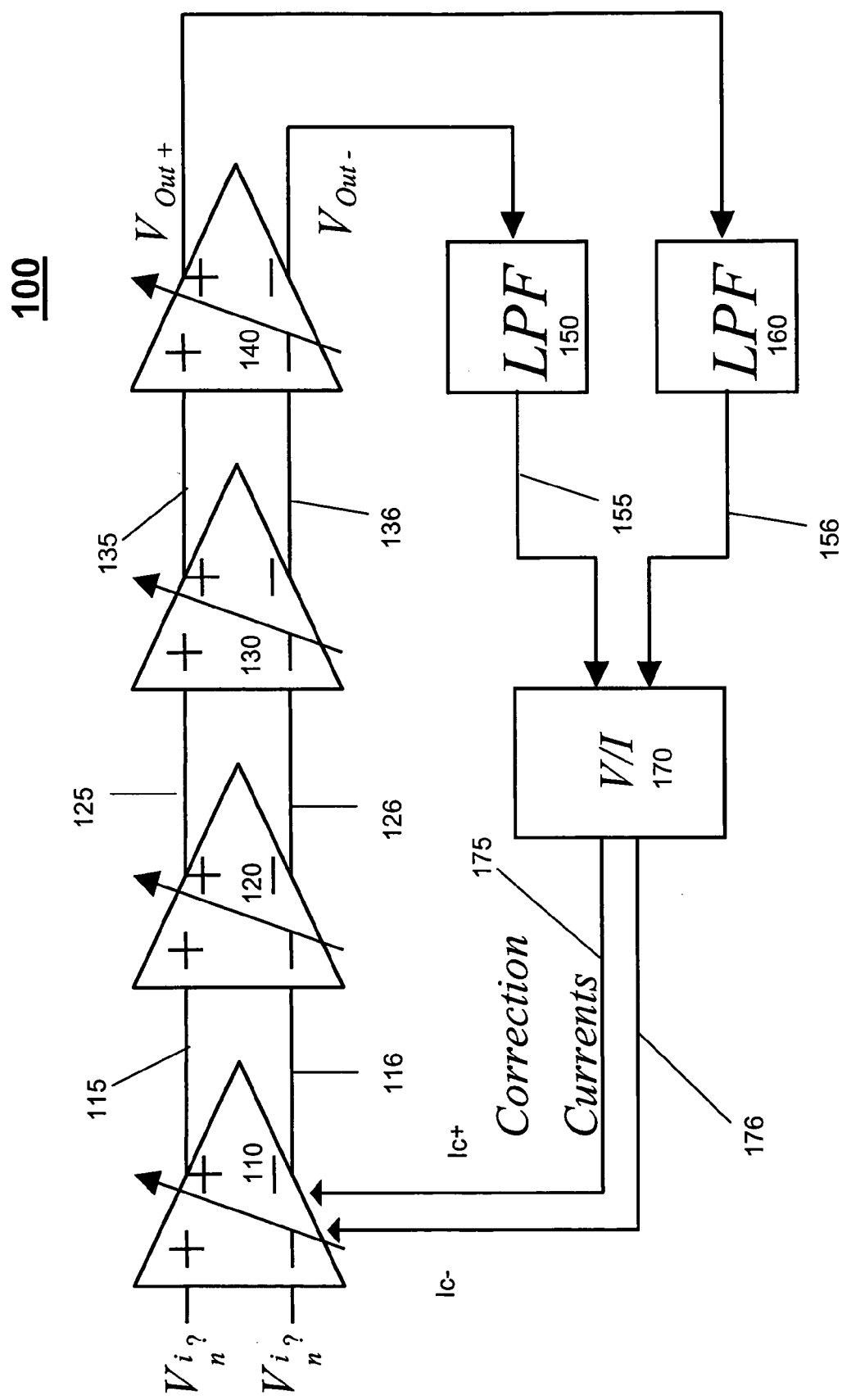
FIG. 1 illustrates a schematic diagram of a variable gain amplifier 100.

FIG. 1 illustrates a schematic diagram of a variable gain amplifier (VGA) 100 in accordance with one embodiment. VGA 100 includes multiple gain stages 110, 120, 130 and 140. Typically, the voltage levels supplied to VGA 100 are either insufficient to drive one or more corresponding circuit elements, such as an analog-to-digital (A/D) converter connected to the outputs of VGA 100, or are too large if supplied to the corresponding circuit element. Therefore, VGA 100 may be used to vary the supplied voltage levels and provide a sufficient voltage gain for further signal processing without compromising data signal integrity. Since VGA 100 is capable of providing such high gain, in one embodiment VGA 100 may be implemented in multiple stages in order to avoid producing too much gain in any one stage, thereby potentially resulting in amplifier instability.

As shown in FIG. 1, VGA 100 may have two input voltage terminals Vin+ and Vin− and two outputs Vout+ and Vout−. VGA 100 may amplify the input signal in accordance with the gain of the amplifier. In one embodiment, VGA 100 may comprise a differential amplifier, such that the gain of the amplifier is based on the difference between the input voltage levels Vin+ and Vin−. The outputs 115 and 116 of first gain stage 110 are supplied to the inputs of second amplifier stage 120. The outputs 125 and 126 of second amplifier stage 120 are supplied to the inputs of third amplifier stage 130. The outputs 135 and 136 of third amplifier stage 130 are supplied to the inputs of fourth amplifier stage 140. Fourth amplifier stage 140 may produce voltage outputs Vout+ and Vout−. Although four amplifier stages are illustrated in FIG. 1, it may be appreciated that any number of gain stages may be used in accordance with a given implementation to provide an almost constant signal to a corresponding circuit device. An example of a corresponding circuit device may include an A/D converter in a wireless receiver. The gain of each stage 110, 120, 130 and 140 of VGA 100 may vary, for example, from 12 decibels (dB) to 18 dB in such wireless applications.

A byproduct of the gain provided by VGA 100 may comprise DC offset. DC offset is the random offset voltage which may cause the outputs of VGA 100 to deviate from the common mode reference. DC offset may occur for a number of reasons, such as manufacturing process parameters, layout mismatches and variations in threshold voltage levels in the various gain stages 110, 120, 130 and 140 of VGA 100. Further, the DC offset may propagate and be further amplified by each of the stages 110, 120, 130 and 140. Consequently, VGA 100 may implement a DC-offset correction technique to prevent VGA 100 from saturating.

VGA 100 may attempt to correct for DC offset by feeding the output voltage signals from VGA 100 back to first gain stage 110, thereby defining a closed-loop DC-offset correction circuit. This may allow VGA 100 to adjust the output DC operating parameters and potentially avoid the effects of large settling times on the operation of the amplifier.

In one embodiment, the closed-loop DC-offset correction circuit of VGA 110 may include a low pass filter (LPF) 150 and a LPF 160. Output terminal Vout− may be connected to LPF 150, and output terminal Vout+ may be connected to LPF 160. Low pass filters 150 and 160 may be arranged to pass frequencies from 0 or DC to a cut-off frequency $f_1$, wherein some attenuation exists for signals that fall off from the cut-off frequency $f_1$.

In one embodiment, the closed-loop DC-offset correction circuit of VGA 110 may include a voltage to current (V/I) converter circuit 170. Voltage to current converter circuit 170 may receive output signals from LPF 150 and LPF 160 via outputs 155 and 156, respectively, and may detect the difference between these two signals. Voltage to current circuit 170 may supply outputs 175 and 176 to first gain stage 110 of VGA 100. In this manner, the DC-offset correction may comprise the supply of the DC signal output by voltage to current circuit 170 which is added to the input signal of VGA 100 via first gain stage 110.

In one embodiment, resistors and capacitors may be implemented in both LPF 150 and LPF 160 to assist in offsetting the undesirable DC component of VGA 100. Leakage current may make the use of holding capacitors impractical in storing correction signals for the DC-offset correction unless thick gate devices are employed. In order to reduce component sizes or die areas in manufacturing VGA 100, however, it may be useful to employ a very high resistance value and a small capacitance value. One reason for this is that the capacitors desired for this type of application may consume a relatively large area or "footprint" in the microcircuit.

Some embodiments may solve these and other problems by implementing techniques to provide a large resistive value and a smaller capacitance for VGA 100 while preserving area of the microcircuit. VGA 100 may be implemented with open loop and closed loop configurations using sub-threshold transistors to emulate resistor values for low voltage circuits used in wireless communication devices and systems. VGA 100 may be described in more detail with reference to FIGS. 2–6.

Figure 2:
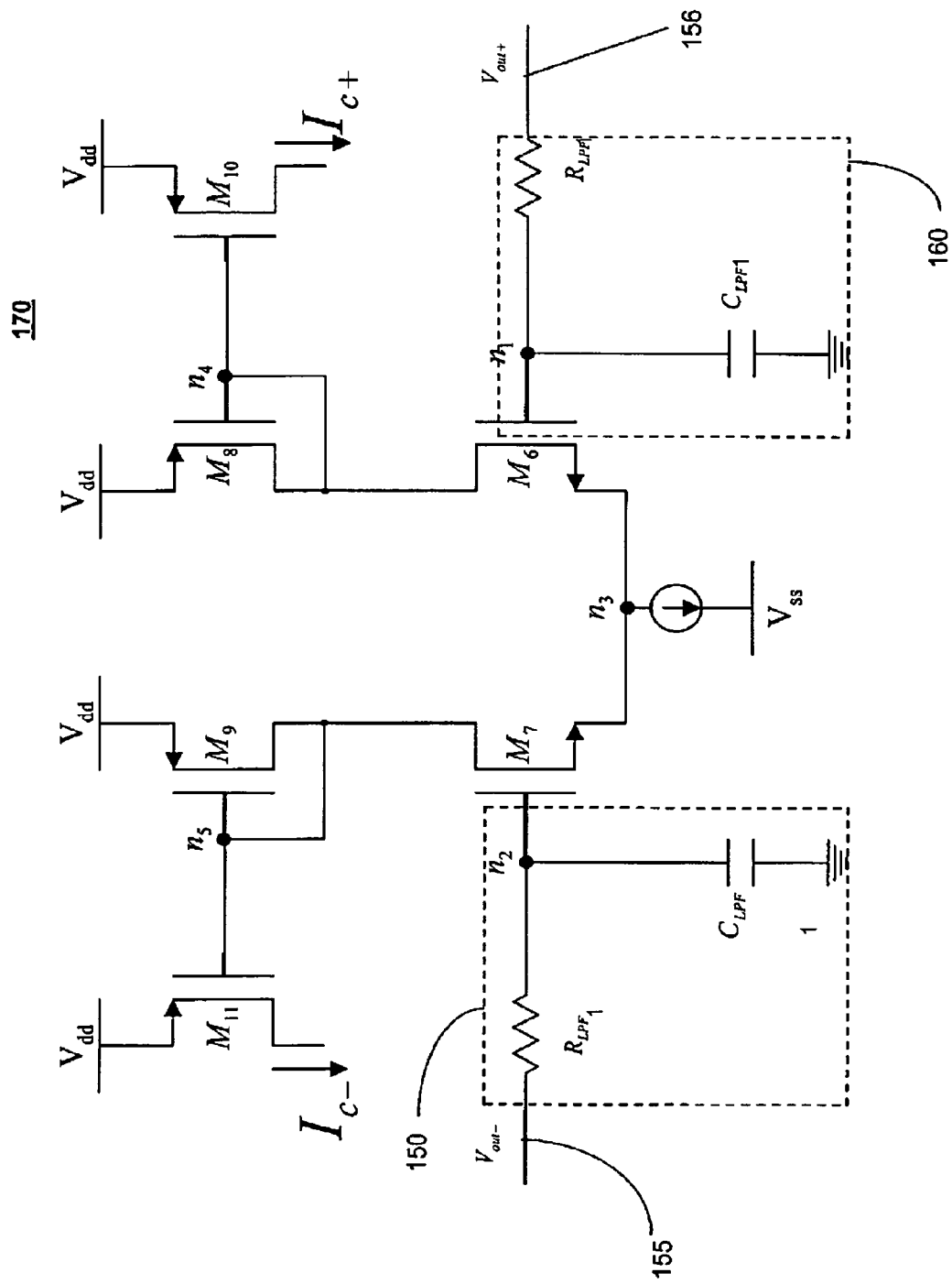
FIG. 2 illustrates a schematic diagram of a voltage to current circuit 170.

FIG. 2 illustrates a schematic diagram of voltage to current circuit 170 for VGA 100 in accordance with one embodiment. Output voltage signals Vout+ and Vout− from gain stage 140 may be supplied to corresponding inputs Vout− and Vout+ of LPF 150 and LPF 160. LPF 150 may comprise $R_{LPF1}$ and $C_{LPF1}$, and LPF 160 may comprise $R_{LPF2}$ and $C_{LPF2}$. Voltage to current circuit 170 may include a differential amplifier comprised of transistors M6 and M7, a first current mirror comprised of transistors M8 and M10, and a second current mirror comprised of transistors M9 and M11. The current mirrors may provide a high effective output resistance, thereby increasing the gain of the differential amplifier comprised of transistors M6 and M7.

Current mirror formed by transistors M8 and M10 may generate correction current Ic+ which is supplied to first gain stage 110 of VGA 100. Similarly, current mirror formed by transistors M9 and M11 may generate correction current Ic− which may be supplied to first gain stage 110 of VGA 100. In this manner, the DC-offset correction may utilize the supply of the direct current signals Ic+ and Ic− from voltage to current circuit 170, which is added to the input signal of the first gain stage 110 of VGA 100.

Figure 3:
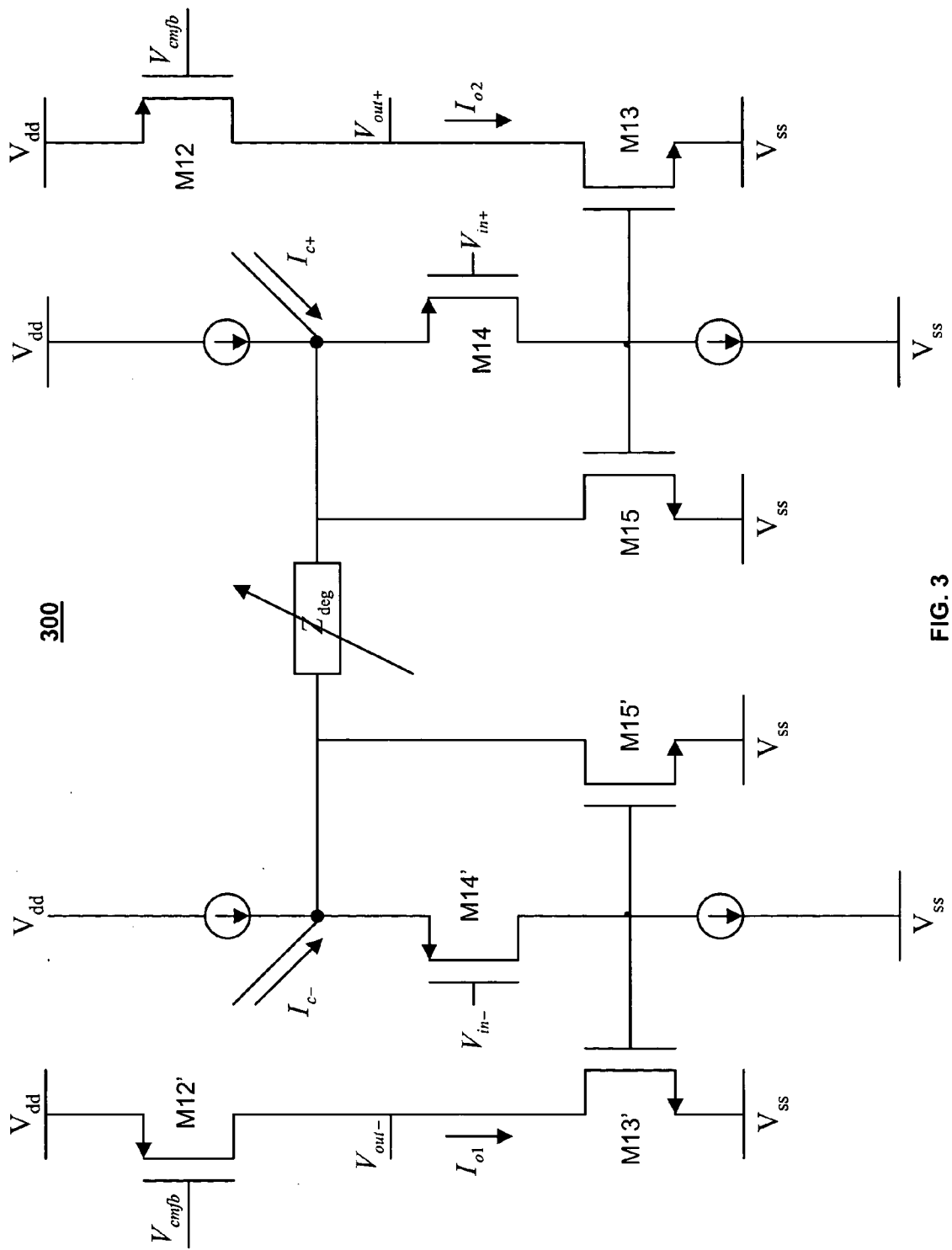
FIG. 3 illustrates a schematic diagram of a gain stage 300.

FIG. 3 is a schematic illustration of a gain stage 300. Gain stage 300 may be representative of a gain stage for a variable gain amplifier, such as one or more gain stages 110, 120, 130 or 140 of VGA 100 as described with reference to FIG. 1. In one embodiment, for example, gain stage 300 may be representative of differential gain stage 110, and FIG. 3 may illustrate the input of correction current supply Ic+ and Ic− to differential gain stage 110. It should be understood, however, that gain stage 300 may also be applicable to each of the differential gains stages 120, 130 and/or 140. The embodiments are not limited in this context.

The differential gain stage provides an amplified gain to a received voltage signal. For example, voltage signal Vin+ may be received at the gate terminal of transistor M14, and may be amplified using transistors M13, M14 and M15. Output signal Vout+ may be supplied by the outputs of transistors M12 and M13. A common mode feedback circuit (not shown) may supply a common mode feedback (cmfb) signal Vcmfb to transistor M12 and M12'. Voltage signal Vin− may be received at the gate terminal of transistor M14, and may be amplified using transistors M12, M13, M14 and M15. Output Vout− may be supplied by the outputs of transistors M12 and M13'. Outputs Vout+ and Vout− may be supplied to a subsequent gain stage of VGA 100, such as gain stage 120, for example. Since the circuit of FIG. 3 is used to depict gain stage 110, the correction current signal Ic+ is provided to transistor M14 and correction current signal Ic− is provided to transistor M14 of gain stage 110. In this manner, the differential voltage input signals are amplified by way of gain stage 110, which also receives correction current signals Ic+ and Ic− from voltage to current circuit 170.

Figure 4:
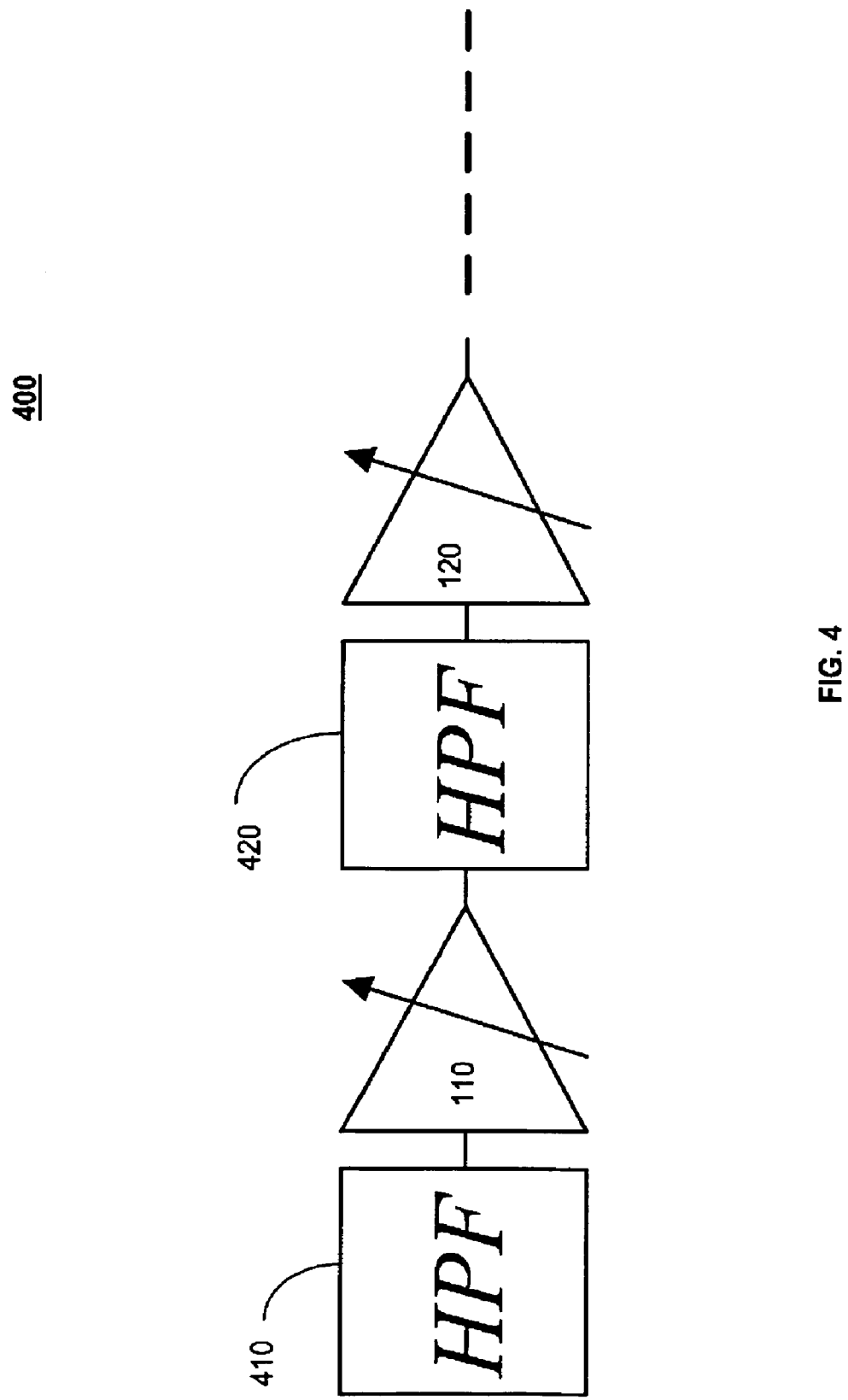
FIG. 4 illustrates a block diagram of a variable gain amplifier 400.

FIG. 4 is a block diagram of a variable gain amplifier with a high-pass filter (HPF) in accordance with one embodiment. FIG. 4 may illustrate a VGA 400. VGA 400 may include an open-loop DC-offset correction circuit to correct for DC-offset generated by the amplifier. VGA 400 may include a HPF 410, differential gain stage 110, a HPF 420, and differential gain stage 120. Although only two gain stages are shown with reference to FIG. 4, it may be appreciated that additional gain stages may be employed. In addition, although VGA 400 is shown in an open-loop DC-offset arrangement, it may be appreciated that VGA 400 may be modified to operate in a closed-loop DC-offset arrangement similar to VGA 100 described with reference to FIG. 1. The embodiments are not limited in this context.

In one embodiment, HPF 410 and HPF 420 may be configured to pass signals having frequencies above a predetermined threshold frequency $f_h$. The output of HPF 410 may be supplied to gain stage 110. The open loop configuration may utilize HPF 410 before first gain 110 to reduce or remove any unwanted DC signals before the first gain stage. The output voltage signals generated by gain stage 110 may be supplied to HPF 420. HPF 410 and HPF 420 may be used to block the DC-offset error from propagating between stages by filtering out the undesirable low frequency DC signals. HPF 410 and HPF 420 may comprise, for example, a resistor and capacitor combination with a small corner frequency to block the DC offset signal without compromising information signal integrity. Similar to the RC combination of LPF 150 and LPF 160, HPF 410 and HPF 420 may be arranged to use large resistor values so that relatively small capacitance values may be employed to reduce consumed area for the microcircuit.

As previously described, large RC values may be needed for HPF 410 and HPF 420 used in the open loop DC-offset correction circuit as shown in FIG. 4, as well as for LPF 150 and LPF 160 used in the closed-loop DC-offset correction circuit as shown in FIG. 1. In one embodiment, for example, the larger resistance values may be emulated by use of one or more sub-threshold transistors. The sub-threshold current is extremely small and a non-linear resistance may be provided. In this manner, the large die area needed for large resistance values will be relatively small as compared to conventional passive resistors. A resistor circuit arranged to provide the appropriate resistance for VGA 100 and VGA 400 may be described in more detail with reference to FIG. 5.

Figure 5:
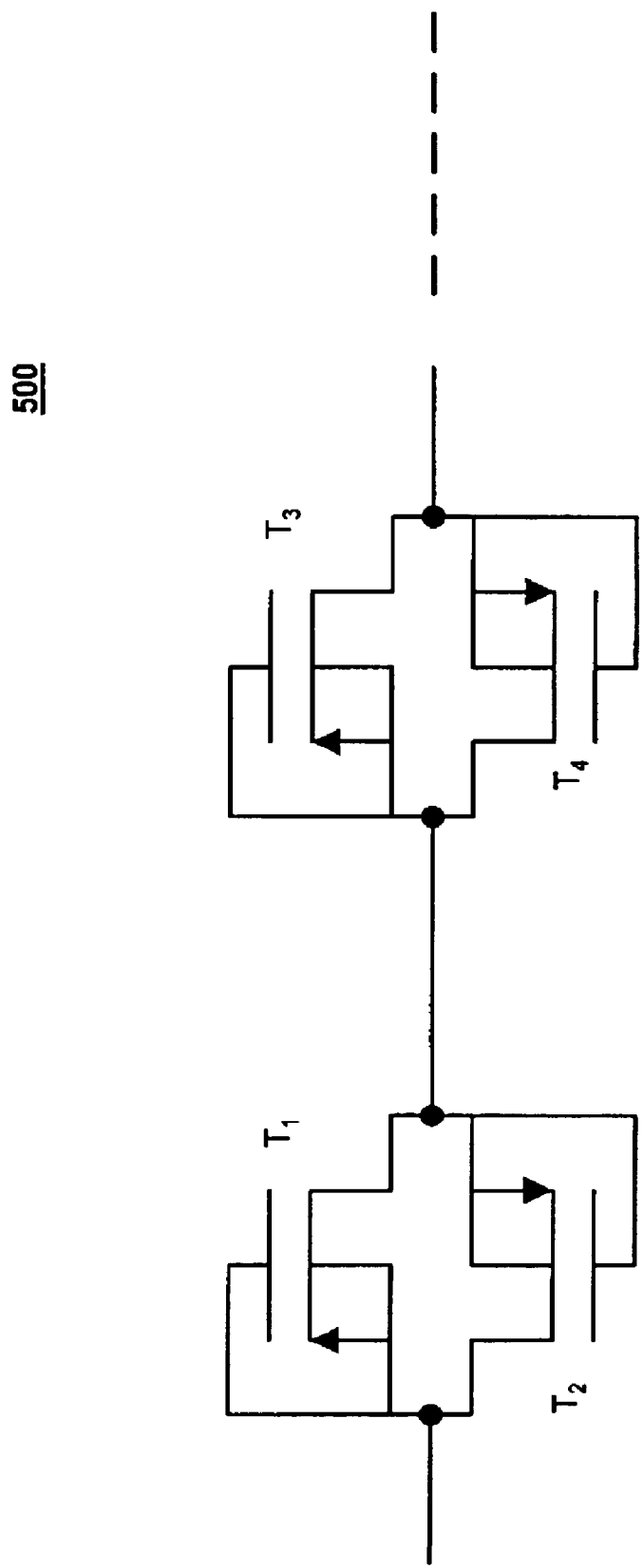
FIG. 5 illustrates a schematic diagram of an equivalent resistor circuit 500.

FIG. 5 illustrates a resistor circuit 500. Resistor circuit 500 may include transistor T1 and transistor T2 in cascaded connection with transistor T3 and transistor T4 to emulate a very large resistor with low distortion. This emulated or equivalent resistance may be utilized in combination with a capacitance value in HPF 410 and HPF 420, and the RC combination of LPF 150 and LPF 160, for example. Transistors T1 and T2 have their respective gate and source terminals connected such that the transistors are operating in the sub-threshold region. Similarly, transistors T3 and T4 have their respective gate and source terminals connected such that the transistors are operating in the sub-threshold region as well.

A modeling technique for the current equation in the sub-threshold transistor region may be given by Equation (1) as follows:

$$I = \mu C_d \frac{W}{L} V_T^2 \exp\left(\frac{V_{GS} - V_{TH}}{\zeta V_T}\right)\left(1 - \exp\left(\frac{-V_{DS}}{V_T}\right)\right) \quad (1)$$

where $C_d$ is the capacitance of the depletion region under the gate, $$V_T = \frac{kT}{q}, \text{ and } \zeta = 1 + \frac{C_d}{C_{ox}}.$$

When the gate terminal is connected to the source terminal, the transistor is operating in the sub-threshold region. Consequently, Equation (1) may be simplified as shown in Equation (2) as follows:

$$I = \mu C_d \frac{W}{L} V_T^2 \exp\left(\frac{-V_{TH}}{\zeta V_T}\right)\left(1 - \exp\left(\frac{-V_{DS}}{V_T}\right)\right) \quad (2)$$

The equivalent resistance between the drain and source can be obtained by differentiating Equation (2) with respect to $V_{DS}$ as shown in Equation (3) as follows:

$$R = \frac{V_T}{I_0} \exp\left(\frac{V_{DS}}{V_T}\right) \quad (3)$$

where $I_0$ may be represented as shown in Equation (4) as follows:

$$I_0 = \mu C_d \frac{W}{L} V_T^2 \exp\left(\frac{-V_{TH}}{\zeta V_T}\right) \quad (4)$$

The non-linearity of the equivalent resistance in equation (3) can be reduced by forcing the drain to source voltage difference to smaller values. This may be accomplished by cascading the sub-threshold transistors as illustrated in FIG. 5.

Figure 6:
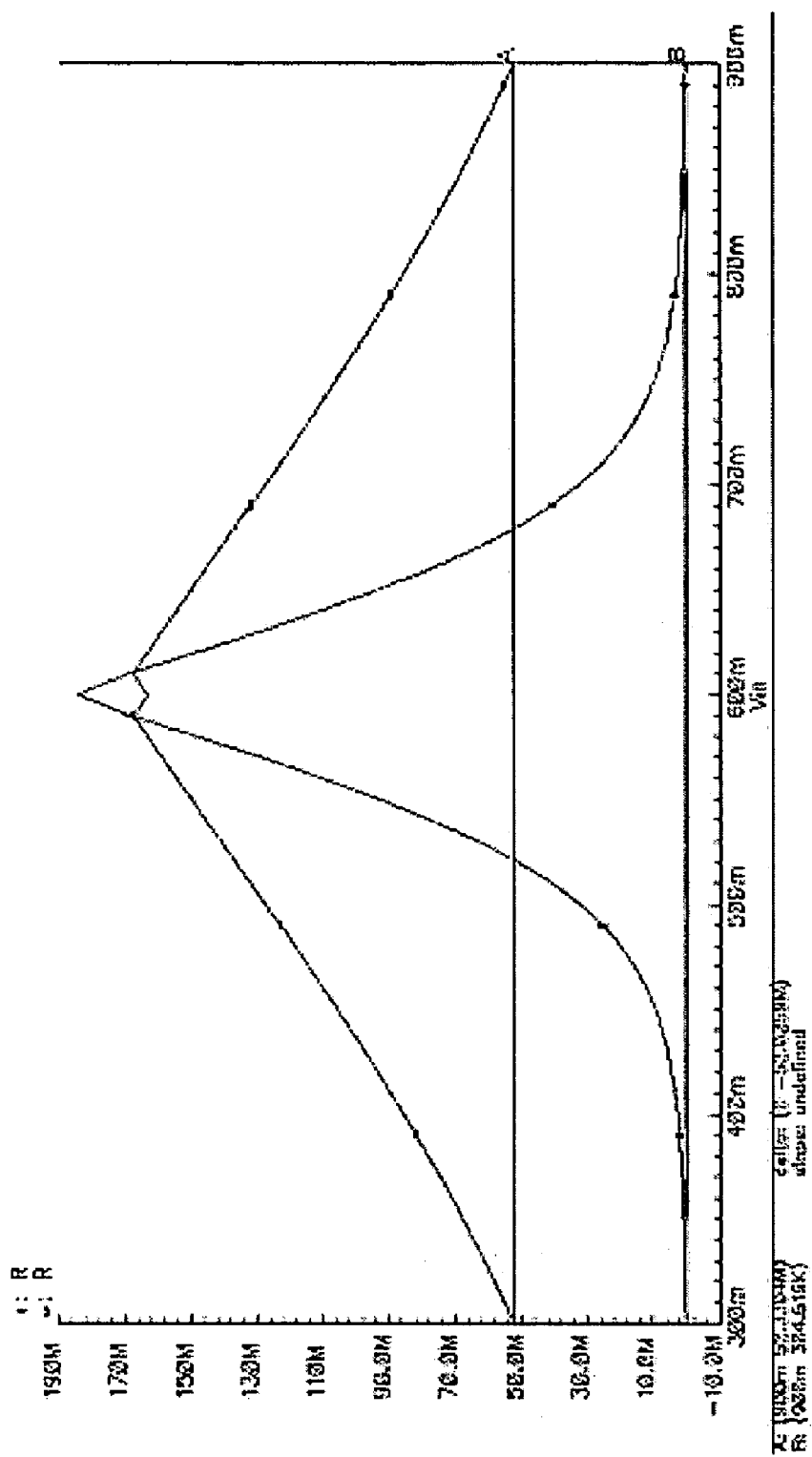
FIG. 6 illustrates resistance values as a function of voltage variation for a cascaded sub-threshold transistor.

FIG. 6 illustrates equivalent resistance values as a function of voltage variation around a DC operating point of Vin=600 mV for the cascaded sub-threshold transistor configuration as shown in FIG. 5. Marker A having a value of 900 mV may correspond to an equivalent resistance of approximately 52.33 M for a four cascaded transistor configuration. In addition, marker B having a value of 900 mV may correspond to an equivalent resistance of approximately 304.5 K for a single sub-threshold transistor configuration. The graph of FIG. 6 may further illustrate, for example, that an equivalent resistance of approximately 120 M may be achieved utilizing the four cascaded transistor configuration when Vin=500 mV. As another example, an equivalent resistance of approximately 130M may be achieved utilizing the four cascaded configuration when Vin=700 mV. These exemplary resistance values and associated transistor configurations may be used in the RC combination of either LPF 150 and LPF 160, or HPF 410 and HPF 420. In this manner, very high resistance values may be achieved using sub-threshold transistor configurations, which may be implemented in filters used to correct for DC-offset in a variable gain amplifier while avoiding large die area requirements associated with passive resistors or n-well implementations.

Some embodiments may be implemented in a wired system, a wireless system, or a combination of both. When implemented as part of wireless system, VGA 100 and VGA 400 may comprise part of a wireless device. A wireless device may be arranged to communicate information over a wireless communication medium, such as radio-frequency (RF) spectrum, for example. The wireless device may include components and interfaces suitable for communicating information signals over the designated RF spectrum. For example, the wireless device may include one or more antennas, wireless RF transmitter/receivers ("transceivers"), amplifiers, filters, control logic, and so forth. Examples of a wireless device may include a mobile or cellular telephone, a computer equipped with a wireless access card or modem, a handheld client device such as a wireless personal digital assistant (PDA), a wireless access point (WAP), a base station (e.g., Node B), a mobile subscriber center (MSC), a radio network controller (RNC), and so forth. The embodiments are not limited in this context.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

It is also worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

While certain features of the embodiments have been illustrated as described herein, many modifications, substitutions, changes and equivalents will now occur to those skilled in the art. It is therefore to be understood that the appended claims are intended to cover all such modifications and changes as fall within the true spirit of the embodiments.

The invention claimed is:

1. An apparatus comprising:
    a variable gain amplifier having an input and an output;
    a direct current offset correction loop to couple to said variable gain amplifier, said direct current offset correction loop having a low pass filter to connect to said output, and a voltage to current converter to connect between said low pass filter and said variable gain amplifier, said voltage to current converter to transform an input voltage to an output current, and said low pass filter to include a resistor circuit having a first pair of transistors arranged to operate in a sub-threshold region and a second pair of transistors arranged to operate is a sub threshold region in cascaded connection with said first pair of transistors.

2. The apparatus of claim 1, wherein each of said transistors include a gate, a drain and source terminals, a first transistor of said pair of transistors having said gate terminal connected to said source terminal.

3. The apparatus of claim 2, wherein said resistance is measured between said drain and source terminals of said first transistor of said pair of transistors.

4. The apparatus of claim 2, further comprising a second transistor of said pair of transistors having said gate terminal connected to said source terminal.

5. The apparatus of claim 4, wherein said resistance is measured between said drain and source terminals of said second of said pair of transistors.

6. The apparatus of claim 1, wherein said variable gain amplifier includes multiple gain stages, each of said gain stages to amplify a signal received at said input.

7. The apparatus of claim 6, wherein said voltage to current converter includes an input connected to said low pass filter and an output connected to a first gain stage from said multiple gain stages, and said voltage to current converter to supply a correction current to said variable gain amplifier.

8. The apparatus of claim 1, wherein said low pass filter is a first low pass filter, said apparatus further comprising a second low pass filter to connect to said output of said variable gain amplifier and to an input of said voltage to current converter.

9. The apparatus of claim 1, wherein said low pass filter further comprises a capacitor to connect to said resistor circuit.

10. The apparatus of claim 1, wherein said variable gain amplifier comprises a differential variable gain amplifier.

11. An apparatus comprising:
a variable gain amplifier having multiple gain stages; and
an open loop direct current offset correction circuit to correct for direct current offset generated by said variable gain amplifier, said open loop circuit comprising a high pass filter arranged to pass signals having a frequency above a predetermined frequency, said high pass filter having an output to connect to an input of a first gain stage from said multiple gain stages, and a resistor circuit having a first pair of transistors arranged to operate in a sub-threshold region and a second pair of transistors arranged to operate is a sub threshold region in cascaded connection with said first pair of transistors.

12. The apparatus of claim 11, wherein said high pass filter comprises a first high pass filter, said apparatus further comprising a second high pass filter to connect between said first gain stage and a second gain stage from said multiple gain stages, and said first and second high pass filters are arranged to block direct current offset signals having a frequency below said predetermined frequency.

13. The apparatus of claim 12, wherein each of said transistors include a gate, a drain and source terminals, a first transistor of said pair of transistors having said gate terminal connected to said source terminal.

14. The apparatus of claim 13, wherein said resistance is measured between said drain and source terminals of said first transistor of said pair of transistors.

15. The apparatus of claim 13, further comprising a second transistor of said pair of transistors having said gate terminal connected to said source terminal.

16. The apparatus of claim 15, wherein said resistance is measured between said drain and source terminals of said second of said pair of transistors.

17. The apparatus of claim 11, wherein said high pass filter further comprises a capacitor to connect to said resistor circuit.

18. A system, comprising:
an antenna;
a receiver to connect to said antenna, said receiver to include:
a variable gain amplifier;
a direct current offset correction circuit to connect to said variable gain amplifier, said direct current offset correction circuit to correct for direct current offset generated by said variable gain amplifier, said direct current offset correction circuit to include a frequency filter circuit; and
wherein said frequency filter circuit is to include a resistor circuit, said resistor circuit to comprise a first pair of transistors arranged to operate in a sub-threshold region and a second pair of transistors arranged to operate is a sub-threshold region in cascaded connection with said first pair of transistors, with a capacitor to connect to said resistor circuit.

19. The system of claim 18, wherein each of said transistors include a gate, a drain and source terminals, a first transistor of said pair of transistors having said gate terminal connected to said source terminal.

20. The system of claim 19, wherein said resistance is measured between said drain and source terminals of said first transistor of said pair of transistors.

21. The system of claim 19, further comprising a second transistor of said pair of transistors having said gate terminal connected to said source terminal.

22. The system of claim 21, wherein said resistance is measured between said drain and source terminals of said second of said pair of transistors.

* * * * *

UNITED STATES PATENT AND TRADEMARK OFFICE
CERTIFICATE OF CORRECTION

PATENT NO. : 7,154,335 B2
APPLICATION NO. : 10/954257
DATED : December 26, 2006
INVENTOR(S) : Elmala et al.

It is certified that error appears in the above-identified patent and that said Letters Patent is hereby corrected as shown below:

In column 6, line 58, in Claim 1, delete "is" and insert -- in --, therefor.

In column 6, line 59, in Claim 1, delete "sub threshold" and insert -- sub-threshold --, therefor.

In column 7, line 37, in Claim 11, delete "is" and insert -- in --, therefor.

In column 7, line 37, in Claim 11, delete "sub threshold" and insert -- sub-threshold --, therefor.

In column 8, line 30, in Claim 18, delete "is" and insert -- in --, therefor.

Signed and Sealed this

Twenty-sixth Day of June, 2007

JON W. DUDAS
*Director of the United States Patent and Trademark Office*